(12) United States Patent
Kim

(10) Patent No.: US 10,447,955 B2
(45) Date of Patent: Oct. 15, 2019

(54) UNIT PIXEL APPARATUS WITH NOISE REDUCTION FUNCTION, OPERATION METHOD THEREOF, AND CMOS IMAGE SENSOR USING THE SAME

(71) Applicant: SK hynix Inc., Gyeonggi-do (KR)

(72) Inventor: Tae-Gyu Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 183 days.

(21) Appl. No.: 15/724,372

(22) Filed: Oct. 4, 2017

(65) Prior Publication Data

US 2018/0213168 A1 Jul. 26, 2018

(30) Foreign Application Priority Data

Jan. 25, 2017 (KR) ........................ 10-2017-0012156

(51) Int. Cl.
| | | |
|---|---|---|
| H04N 5/363 | (2011.01) | |
| H04N 5/3745 | (2011.01) | |
| H01L 27/146 | (2006.01) | |
| H04N 5/357 | (2011.01) | |
| H04N 5/378 | (2011.01) | |

(52) U.S. Cl.
CPC ....... *H04N 5/363* (2013.01); *H01L 27/14603* (2013.01); *H01L 27/14605* (2013.01); *H01L 27/14614* (2013.01); *H01L 27/14641* (2013.01); *H01L 27/14643* (2013.01); *H04N 5/3577* (2013.01); *H04N 5/378* (2013.01); *H04N 5/37457* (2013.01)

(58) Field of Classification Search
CPC ...... H04N 5/363; H04N 5/3577; H04N 5/378; H04N 5/37457; H01L 27/14643; H01L 27/14641; H01L 27/14614; H01L 27/14605; H01L 27/14603
USPC ...................................... 250/208.1
See application file for complete search history.

(56) References Cited

U.S. PATENT DOCUMENTS 9,286,832 B2 * 3/2016 Park ..................... G09G 3/3291
9,609,245 B2 * 3/2017 Iwata ..................... H04N 5/376

FOREIGN PATENT DOCUMENTS

JP 2013-058505 3/2013
KR 1020130134657 12/2013

\* cited by examiner

*Primary Examiner* — Seung C Sohn
(74) *Attorney, Agent, or Firm* — IP & T Group LLP

(57) ABSTRACT

A unit pixel apparatus includes a unit pixel suitable for supporting initialization an output node and outputting a pixel signal corresponding to incident light through the output node; and a switching block suitable for initializing the output node and deciding an initial voltage of the output node.

15 Claims, 4 Drawing Sheets

UNIT PIXEL APPARATUS WITH NOISE REDUCTION FUNCTION, OPERATION METHOD THEREOF, AND CMOS IMAGE SENSOR USING THE SAME

CROSS-REFERENCE TO RELATED APPLICATIONS

The present application claims priority of Korean Patent Application No. 10-2017-0012156, filed on Jan. 25, 2017, which is incorporated herein by reference in its entirety.

BACKGROUND

1. Field

Exemplary embodiments of the present invention relate to a Complementary Metal Oxide Semiconductor (CMOS) image sensor (CIS), and more particularly, to a unit pixel apparatus capable of reducing or removing an influence due to Random Telegraph Signal (RTS) noise occurring in a CIS, an operation method of the unit pixel apparatus, and the CIS using the same.

2. Description of the Related Art

In general in a CMOS image sensor (CIS) in order to allow a current source or a pixel biasing device to normally operate as a constant current source, output impedance value of the current source should be very large.

However, when a drain current of a source follower transistor may be randomly changed by a trap and/or a de-trap of the source follower transistor, that is, when RTS noise occurs, a voltage of an output node is largely changed in proportional to an output impedance value of the current source.

A change in the voltage of the output node has a positive feedback relationship with a change in a voltage of a floating diffusion node. Accordingly, the change in the voltage of the output node proportionately changes the voltage of the floating diffusion node and the changed voltage of the floating diffusion node feeds back to a change in the voltage of the output node.

That is, the RTS noise simultaneously has an influence on a change in the voltage of the output node and a change in the voltage of the floating diffusion node due to a relationship that the RTS noise has an influence on a change in the voltage of the output node in proportional to the output impedance value of the current source and the positive feedback relationship between the change in the voltage of the output node and the change in the voltage of the floating diffusion node, resulting in a problem that erroneous image information is transferred.

SUMMARY

According to one aspect of the present invention there is provided a unit pixel apparatus for a CIS, the unit pixel apparatus being capable of reducing or removing an influence due to Random Telegraph Signal (RTS) noise occurring in a CIS.

Another aspect of the present invention is directed to an operation method of the unit pixel apparatus, and yet another aspect of the present invention is directed to a CIS employing the unit pixel apparatus. An embodiment of the present invention is directed to a unit pixel apparatus that reduces output impedance by using a switching block instead of an existing current source, thereby reducing or removing an influence due to RTS noise and reduce power consumption.

A unit pixel apparatus may include a unit pixel suitable for supporting initialization of an output node and outputting a pixel signal corresponding to incident light through the output node; and a switching block suitable for initializing the output node and deciding an initial voltage of the output node.

An operation method of a unit pixel apparatus in accordance with an embodiment may include resetting a floating diffusion node of the unit pixel apparatus initializing an output node of the unit pixel apparatus, and deciding an initial voltage value of the output node; reading out a reset signal transferring photo charge to the floating diffusion node, initializing the output node, and deciding the initial voltage value of the output node; and reading out a pixel signal.

A CMOS image sensor in accordance with an embodiment may include a unit pixel suitable for supporting initialization of an output node and outputting a pixel signal corresponding to incident light through the output node; a switching block suitable for initializing the output node and deciding an initial voltage of the output node; and a read-out processing unit suitable for reading out the pixel signal.

In accordance with an embodiment, it is possible to reduce or remove an influence by RTS noise occurring in a CMOS image sensor (CIS) and to reduce power consumption.

That is, in accordance with the embodiment, instead of an existing current source, a switching block is used to reduce output impedance, so that it is possible to reduce or remove an influence by RTS noise and to reduce power consumption.

BRIEF DESCRIPTION OF THE DRAWINGS

The above and other features and advantages of the present invention will become more apparent to those skilled in the art to which the present invention pertains by the following detailed description with reference to the attached drawings in which.

DETAILED DESCRIPTION

Figure 1:
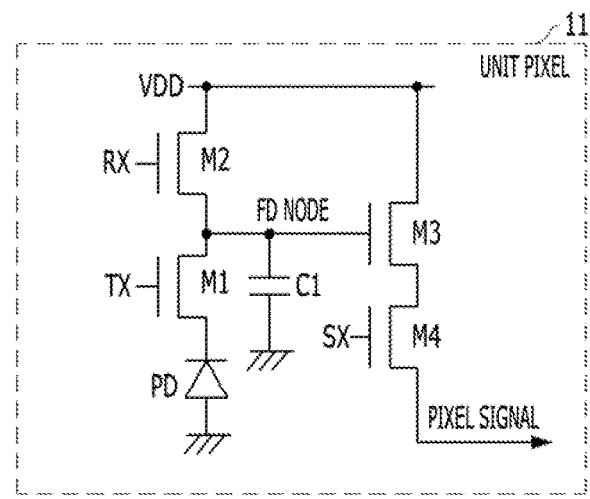
FIGS. 1 and 2A are exemplary circuit diagrams illustrating unit pixels

Various embodiments will be described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the present invention to those skilled in the art. Throughout the disclosure, like reference numerals refer to like parts throughout the various figures and embodiments of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to more clearly illustrate the various elements of the embodiments. For example, in the drawings, the size of elements and the intervals between elements may be exaggerated compared to actual sizes and intervals for convenience of illustration.

It will be further understood that when an element is referred to as being "connected to", or "coupled to" another element, it may be directly on, connected to or coupled to the other element, or one or more intervening elements may be present. In addition, it will also be understood that when an element is referred to as being "between" two elements, it may be the only element between the two elements, or one or more intervening elements may also be present.

The phrase "at least one of . . . and . . . ," when used herein with a list of items, means a single item from the list or any combination of items in the list. For example, "at least one of A, B, and C" means, only A, or only B, or only C, or any combination of A, b, and C.

Spatially relative terms, such as "under," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in manufacturing, use or operation in addition to the orientation depicted in the figures. For example, if the device in the figures is turned over, elements described as "below" or "under" other elements or features would then be "above" the other elements or features. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element (also referred to as feature) described in connection with one embodiment may be used singly or in combination with other elements of another embodiment, unless specifically indicated otherwise.

Hereinafter, the various embodiments of the present invention will be described in detail with reference to the attached drawings.

Exemplary embodiments relate to a Complementary Metal Oxide Semiconductor (CMOS) image sensor (CIS), and more particularly, to a unit pixel apparatus capable of reducing or removing an influence due to Random Telegraph Signal (RTS) noise occurring in a CIS, an operation method of the unit pixel apparatus, and the CIS using the same.

Terms used in this disclosure will be described below.

Random Telegraph Signal (RTS) noise represents irregular or random change in a drain current or a critical voltage. The RTS noise is caused by a trap and/or a de-trap of a source follower transistor.

A small output impedance value of a switching block represents a value smaller than an output impedance value of an existing current source.

A residual voltage represents a pixel output voltage, which is generated by a previous process but currently remains in an output node.

FIG. 1 is an exemplary circuit diagram illustrating a unit pixel 11.

Referring to FIG. 1, the unit pixel 11 includes a photosensitive device (PD), a transfer transistor M1, a reset transistor M2, a source follower transistor M3 and a selection transistor M4.

The PD performs a photoelectric conversion operation. That is, the PD converts incident light into photo charges. The PD may be turned on or off in response to a control signal provided from a control unit such as a timing generator (not illustrated). When the PD is in a turned-on state, the PD may sense incident light and generate photo charges. When the PD is in a turned-off state, the PD does not sense incident light. The PD may be implemented with any one of a photodiode, a phototransistor, a photogate, a pinned photodiode (PPD), and a combination thereof.

The transfer transistor M1 transfers the photo charge of the photosensitive device (PD) electrically coupled to one end thereof to a floating diffusion node electrically coupled to the other end thereof in response to a transfer control signal TX applied to the gate of the transfer transistor M1.

The reset transistor M2 transfers a power supply voltage VDD applied from one terminal thereof to the floating diffusion node electrically coupled to the other terminal thereof in response to a reset control signal RX applied to the gate of the reset transistor M2. That is, the reset transistor M2 resets photo charge stored in the FD node in response to the reset control signal RX. The power supply voltage VDD applied to a drain terminal of the reset transistor M2 is an initialization voltage of the reset transistor M2.

The source follower transistor M3 has one terminal electrically coupled to the power supply voltage VDD, generates an electrical signal corresponding to charge stored in the floating diffusion node electrically coupled to a gate terminal thereof, and outputs the electrical signal to the other terminal. The source follower transistor M3 serves as a source follower buffer amplifier.

The selection transistor M4 operates in response to a select control signal SX and outputs the electrical signal provided from the source follower transistor M3 as a pixel signal. The selection transistor M4 performs a switching operation for selecting the unit pixel 11 in response to the select control signal SX, and an address operation.

The transfer transistor M1 and the reset transistor M2 are coupled at the FD node, and the FD node stores charge corresponding to a video signal or charge corresponding to an initialization voltage, Therefore, the FD node may be functioned as a capacitor C1.

The FD node stores charges corresponding to the power supply voltage VDD or the initialization voltage provided through the reset transistor M2. That is, the reset transistor M2 is turned on to initialize the FD node. Then, the transfer transistor M1 is turned on to transfer a charge corresponding to an image signal to the FD node from the photodiode (PD).

Figure 2A:
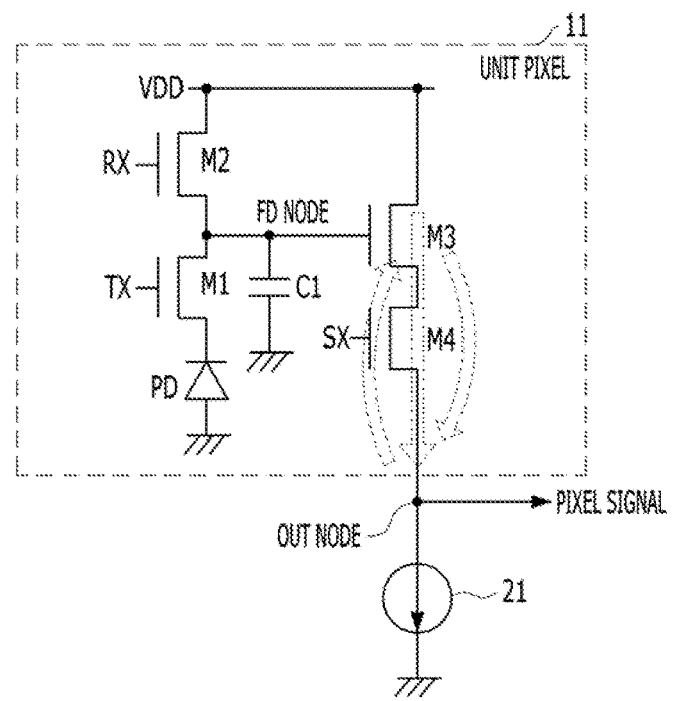
Figure 2B:
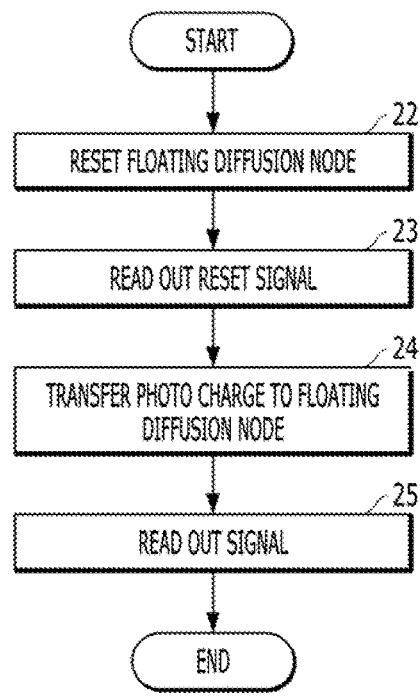
FIG. 2B is a simplified flowchart of an operation method of the unit pixel apparatus shown in FIG. 2A.
Figure 2C:
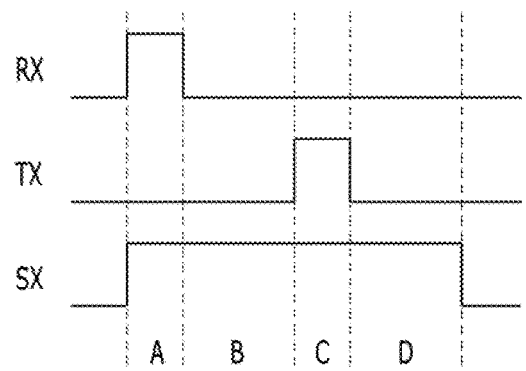
FIG. 2C is a waveform illustrating an operation of the unit pixel apparatus shown in FIG. 2A.

FIG. 2A is a circuit diagram illustrating a unit pixel apparatus. FIG. 2B is a flowchart illustrating an operation method of the unit pixel apparatus of FIG. 2A, FIG. 2C is a waveform illustrating an operation of the unit pixel apparatus shown in FIG. 2A.

As illustrated in FIG. 2A, the unit pixel apparatus includes the unit pixel 11 for outputting the pixel signal corresponding to incident light, and a current source or a pixel biasing device 21 for biasing the pixel signal according to a bias current provided from an external bias current generator (not illustrated).

Referring to FIGS. 1 and 2A to 2C, during a period A in which the select control signal SX and the reset control signal RX are enabled, the FD node is reset at step 22. That is, after the selection transistor M4 is turned on according to the select control signal SX at a high level, the reset transistor M2 is turned on according to the reset control signal RX at a high level so that photo charge stored in the FD node is reset at a predetermined cycle for a correlated double sampling (DS) operation.

During a reset signal read-out period B in which the select control signal SX is enabled, a reset signal is read out at step 23. That is, the source follower transistor M3 generates an electrical signal corresponding to the charge stored in the FD node at the time of the reset, and outputs the generated signal as the reset signal.

During a period C in which the select control signal SX and the transfer control signal TX are enabled, the photo charge corresponding to a video signal is transferred to the FD node at step 24. That is, when the transfer control signal TX has a high level, the transfer transistor M1 is turned on, so that the photo charge generated in the PD is transferred to the FD node FD.

During a signal read-out period D in which the select control signal SX is enabled, a pixel signal is read out at step 25. That is, the source follower transistor M3 generates an electrical signal according to charge corresponding to the video signal and stored in the FD node, and outputs the generated signal as the pixel signal.

In general, the output impedance of the current source 21 should be very large. That is, in order to allow the current source 21 to normally operate as a constant current source, an output impedance value of the current source 21 should be about several hundreds of mega ohm, for example, from about 300 MΩ to about 700 MΩ.

However, when a drain current of the source follower transistor M3 is randomly changed by a trap and/or a de-trap of the source follower transistor M3, that is, when RTS noise occurs, a voltage of an output node OUT is largely changed.

This is because a change in the drain current of the source follower transistor M3 has an influence on a change in the voltage of the output node OUT in proportional to the output impedance value of the current source 21. That is, as described above, since the output impedance value of the current source 21 is very large, the voltage of the output node OUT is largely changed due to relatively small change in the drain current of the source follower transistor M3.

The change in the voltage of the output node OUT has a positive feedback relationship with a change in the voltage of the FD node. Accordingly the change in the voltage of the output node OUT proportionally changes the voltage of the FD node and the changed voltage of the FD node feeds back to a change in the voltage of the output node OUT.

However, since a gain of the source follower transistor M3 is smaller than 1 and ratio of the voltage change in the FD node to the voltage change in the output node OUT is also smaller than 1, variation of the voltages is converged to a constant value.

In brief, the positive feedback relation between the voltage change in the output node OUT and the voltage change in the FD node has an influence on both voltage changes. However, since the gain of the source follower transistor is smaller than 1 and the ratio of the voltage change in the FD node to the voltage change in the output node is also smaller than 1, variation of the voltages is converged to a constant value. Furthermore, when the drain current of the source follower transistor is randomly changed by the trap and/or the de-trap of the source follower transistor, that is, when the RTS noise occurs, the voltage of the output node OUT is largely changed proportionally to the output impedance value of the current source.

That is, the RTS noise simultaneously has an influence on the voltage change in the output node OUT and the voltage change in the FD node according to the relationship that the RTS noise has an influence on the voltage change in the output node OUT proportionally to the output impedance value of the current source and the positive feedback relationship between the voltage change in the output node and the voltage change in the FD node resulting in the transfer of erroneous image information.

The present invention solves this problem by providing a unit pixel apparatus which instead of using an existing current source, it employs a switching block for reducing the output impedance so that it is possible to reduce or remove an influence due to the RTS noise and to reduce power consumption. The unit pixel apparatus according to an embodiment of the present invention will be described in detail with reference to FIG. 3A to FIG. 3C.

Figure 3A:
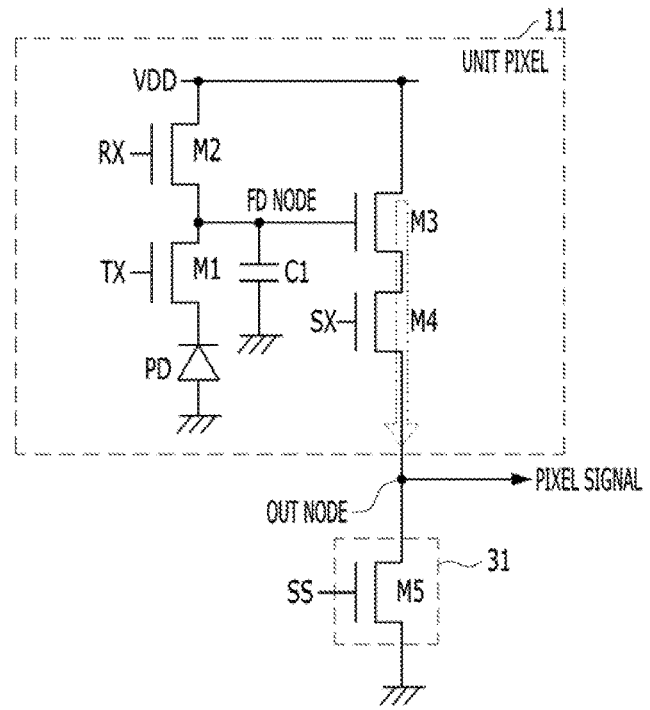
FIG. 3A is a circuit diagram illustrating a unit pixel apparatus in accordance with an embodiment of the present invention.
Figure 3B:
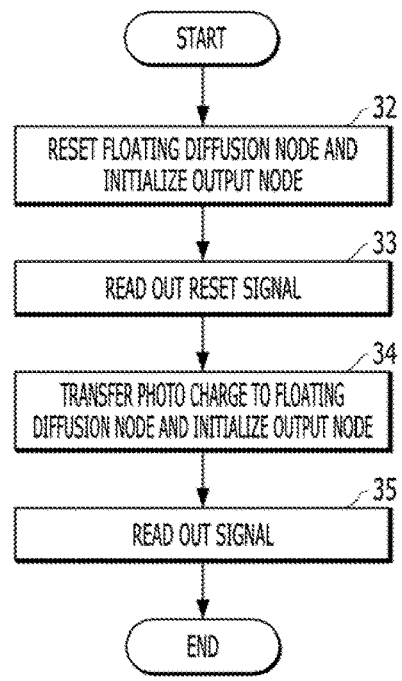
FIG. 3B is a simplified flowchart of an operation method of the unit pixel apparatus shown in FIG. 3A.
Figure 3C:
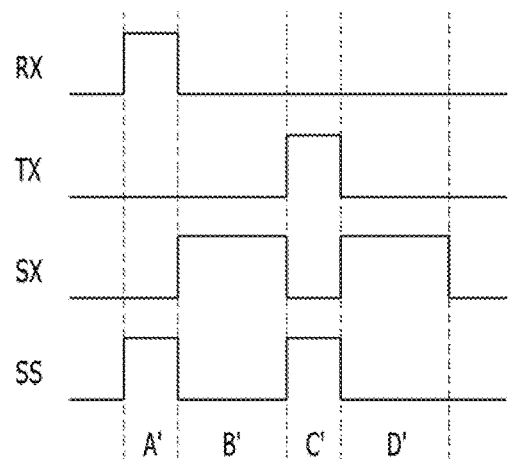
FIG. 3C is a waveform illustrating the unit pixel apparatus shown in FIG. 3A.

FIG. 3A is a circuit diagram illustrating a unit pixel apparatus in accordance with an embodiment of the present invention. FIG. 3B is a flowchart illustrating an operation method of the unit pixel apparatus of FIG. 3A. FIG. 3C is a waveform illustrating the unit pixel apparatus of FIG. 3A.

As illustrated in FIG. 3A, the unit pixel apparatus in accordance with the embodiment includes the unit pixel 11 for supporting initialization of an output node OUT and outputting the pixel signal corresponding to incident light through the output node, and a switching block 31 for initializing the output node to decide an initial voltage value. It is noted however, that the unit pixel 11 is simply an example, and that a different unit pixel may also be used without departing from the scope of the invention.

Referring to FIGS. 1 and 3A, it is preferable that the switching block 31 is implemented with a single transistor M5 which is switched according to a switching control signal SS from an external control unit such as a timing generator (not illustrated). However, the switching block 31 may also be implemented with other well-known elements and technologies. The single transistor M5 has a drain terminal electrically coupled to the output node OUT, operates in response to the switching control signal SS applied to a gate terminal thereof, transfers a residual voltage of the output node OUT to a ground through a source terminal thereof, and initializes the output node OUT, thereby deciding the initial voltage value. The residual voltage needs to be removed in order to prevent an error in image information.

The switching block 31 should be implemented with a MOS transistor having an output impedance value (for example, 0Ω to 0.01Ω) that is substantially smaller than the output impedance value (for example, 300 MΩ to 700 MΩ) of an existing current source 21. Preferably, the switching block 31 should be implemented with an output impedance value of from about 0Ω to 10Ω, more preferably from about 0Ω to 1Ω and most preferably from about 0Ω to about 0.01Ω. The RTS noise cannot be completely cleaned as long as the current source 21 is used. In this regard, in the embodiment, in order to reduce or remove an influence due to the RTS noise, the simple switching block 31 having a very small output impedance value is used instead of the existing current source 21 as illustrated in FIG. 3A, and a pixel signal is allowed to be stored in a comparator (not illustrated) of a rear stage.

In accordance with an embodiment of the present invention, the simple switching block 31 having a very small output impedance value is used instead of the existing current source 21. Due to the replacement, there is no large change in the voltage of the output node OUT even though the drain current of the source follower transistor M3 is randomly changed by the trap and/or the de-trap of the source follower transistor M3, that is, even though the RTS noise occurs.

Specifically, it has been observed that a change in the drain current of the source follower transistor M3 has an influence on a change in the voltage of the output node OUT proportionally to the output impedance value of the switching block 31. That is, as described above, since the output impedance value of the switching block 31 is very small, even though there is a change in the drain current of the source follower transistor M3, the voltage of the output node is not changed substantially. That is, even though the RTS noise occurs, its influence is reduced or removed.

The voltage change in the output node OUT has a positive feedback relationship with the voltage change in the FD node, similarly to the use of the existing current source 21. Accordingly, the voltage change in the output node OUT proportionally changes the voltage of the FD node and the changed voltage of the FD node feeds back to a change in the voltage of the output node OUT.

However, since the gain of the source follower transistor is smaller than 1 and the ratio of the voltage change in the FD node to the voltage change in the output node is also smaller than 1, the final voltage of the output node OUT is converged to a value smaller than a threshold voltage, similarly to the operation of the source follower transistor.

The RTS noise may be introduced, but since the output current of the source follower transistor M3 is finally converged to a value of zero (0) the RTS noise value is reduced.

That is, an influence due to the RTS noise introduced during a stabilization step of the output current of the source follower transistor is reduced or removed because the output impedance value of the switching block 31 is small. After the stabilization step, the RTS noise value is reduced because the output current of the source follower transistor has been converged to the value of zero (0).

In brief, in the embodiment, instead of the current source 21, the switching block 31 is used to reduce an output impedance value, and the output current of the source follower transistor is allowed to be converged to 0, so that it is possible to reduce or remove an influence due to the RTS noise caused during the operation and to reduce the occurrence of the RTS noise after data conversion.

Referring to FIGS. 3B and 3C, during a period A' in which the reset control signal RX and the switching control signal SS are enabled and the select control signal SX is disabled, the FD node FD is reset and the output node is initialized, so that an initial voltage value is decided at step 32. That is, the reset transistor M2 is turned on to a high level according to the reset control signal RX, and a photo charge stored in the FD node is reset at a predetermined cycle for the correlated double sampling (CDS) operation.

In the state in which the selection transistor M4 is turned off according to the select control signal SX at a low level, the transistor M5 of the switching block 31 is turned on according to the switching control signal SS at a high level, a residual voltage (for example, a signal remaining in the output node OUT in a signal read-out process of a previous cycle) remaining in the output node OUT is removed to the ground to initialize the output node OUT, so that the initial voltage value is decided. During the period A' in which the output node OUT is initialized, the selection transistor M4 is turned off, so that an output path to the output node OUT is blocked. That is, during the period A', since the selection transistor M4 is turned-off according to the select control signal SX at a low level, the positive feedback relationship between the voltage change in the output node OUT and the voltage change in the FD node is not established.

During a reset signal read-out period B' in which the select control signal SX is enabled, a reset signal is read out at step 33. That is, the source follower transistor M3 generates an electrical signal corresponding to charge stored in the FD node at the time of the reset and outputs the generated signal as the reset signal.

During a period C' in which the transfer control signal TX and the switching control signal SS are enabled and the select control signal SX has been disabled a photo charge corresponding to a video signal is transferred to the FD node and the output node OUT is initialized, so that the initial voltage value is decided at step 34. That is, when the transfer control signal TX has a high level, the transfer transistor M1 is turned on, so that photo charge generated in the PD is transferred to the FD node FD.

In the state in which the selection transistor M4 is turned off according to the select control signal SX at a low level, the transistor M5 of the switching block 31 is turned on according to the switching control signal SS at a high level, a residual voltage (for example, a reset signal remaining in the output node OUT during the rest signal read-out step 33) remaining in the output node OUT is removed to the ground to initialize the output node OUT, so that the initial voltage value is decided. During the period C', since the selection transistor M4 is turned-off according to the select control signal SX at a low level, the positive feedback relationship between the voltage change in the output node OUT and the voltage change in the FD node is not established.

During a signal read-out period D' in which the select control signal SX is enabled, a pixel signal is read out at step 35. That is, the source follower transistor M3 generates an electrical signal according to charge corresponding to the video signal and stored in the FD node, and outputs the generated signal as the pixel signal.

Figure 4:
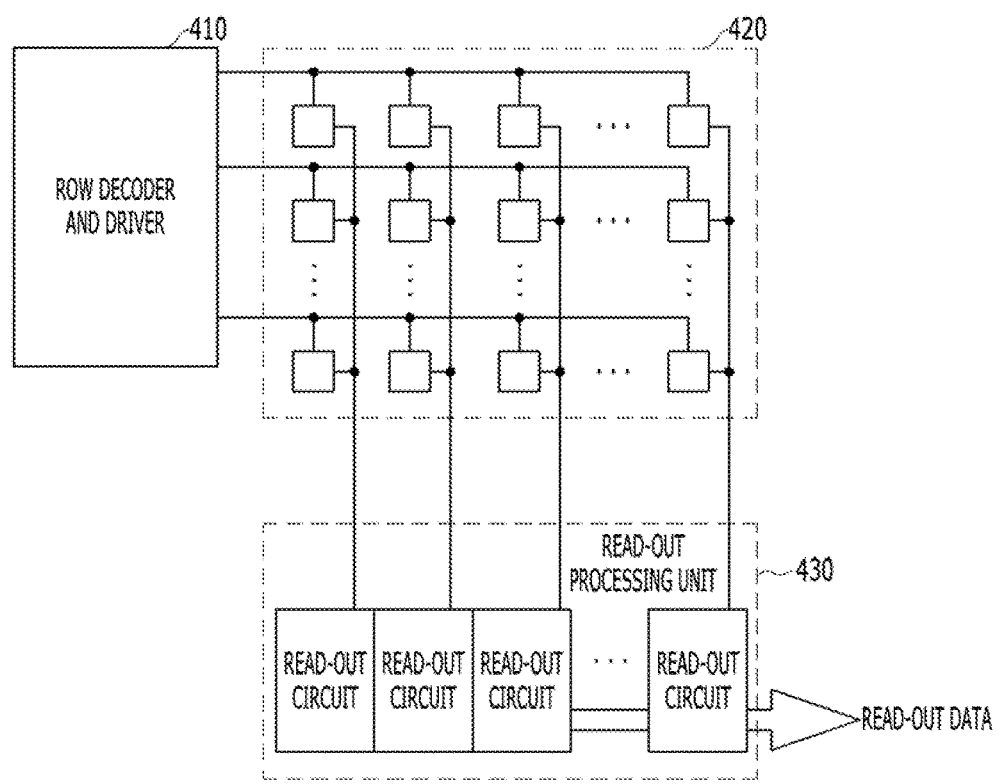
FIG. 4 is a block diagram illustrating a CIS including the unit pixel apparatus shown in FIG. 2A.

FIG. 4 is a block diagram illustrating a CIS including the unit pixel apparatus of FIG. 3A.

As illustrated in FIG. 4, the CIS includes a row decoder and driver 410, a pixel array 420, and a read-out processing unit 430.

In the row decoder and driver 410, unit pixels selected by the row decoder 410 among unit pixels in the pixel array 420 are driven by the row driver 410.

The pixel array 420 senses light by using a photonic device and generates a pixel signal (a pixel output signal) corresponding to the sensed light, The selected and driven unit pixel outputs the pixel signal. The outputted pixel signal is an analog pixel signal which is an electrical signal, and includes a reset voltage and a signal voltage.

The read-out processing unit 430 reads out the pixel signal outputted from the pixel array 420, and outputs read-out data.

Although various embodiments have been described for illustrative purposes, it will be apparent to those skilled in the art that various changes and modifications may be made without departing from the spirit and scope of the invention as defined in the following claims.

What is claimed is:

1. A unit pixel apparatus comprising:
 a unit pixel suitable for supporting initialization of an output node and outputting a pixel signal corresponding to incident light through the output node; and
 a switching block suitable for initializing the output node and deciding an initial voltage of the output node.

2. The unit pixel apparatus of claim 1, wherein the switching block includes a single transistor controlled by a switching control signal provided from an external control unit.

3. The unit pixel apparatus of claim 2, wherein the single transistor has a drain terminal electrically coupled to the output node, operates according to the switching control signal applied to a gate terminal of the single transistor, removes a residual voltage of the output node to a ground through a source terminal, and initializes the output node, thereby deciding the initial voltage value.

4. The unit pixel apparatus of claim 1, wherein the switching block includes a MOS transistor having an output impedance value ranging from about 0Ω to about 0.01Ω.

5. The unit pixel apparatus of claim 1, wherein the unit pixel blocks an output path to the output node during a period in which the output node is initialized.

6. An operation method of a unit pixel apparatus, comprising:
 resetting a floating diffusion node of the unit pixel apparatus, initializing an output node of the unit pixel apparatus, and deciding an initial voltage value of the output node;
 reading out a reset signal;
 transferring photo charge to the floating diffusion node, initializing the output node, and deciding the initial voltage value of the output node; and
 reading out a pixel signal.

7. The operation method of claim 6, wherein the resetting of the floating diffusion node of the unit pixel apparatus is performed during a period in which a reset control signal and a switching control signal are enabled and a select control signal is disabled.

8. The operation method of claim 6, wherein the resetting of the floating diffusion node of the unit pixel apparatus includes:
 turning on a reset transistor of the unit pixel apparatus resetting photo charge stored in the floating diffusion node;
 turning on a switching block of the unit pixel apparatus when turning off a selection transistor of the unit pixel apparatus; and
 removing a residual voltage remaining in the output node to initialize the output node.

9. The operation method of claim 6, wherein the transferring of the photo charge is performed during a period in which a transfer control signal and a switching control signal are enabled and a select control signal has been disabled.

10. The operation method of claim wherein the transferring of the photo charge includes:
 turning on a transfer transistor of the unit pixel apparatus;
 transferring photo charge to the floating diffusion node;
 turning on a switching block of the unit pixel apparatus when turning off a selection transistor of the unit pixel apparatus; and
 removing a residual voltage remaining in the output node to initialize the output node.

11. A CMOS image sensor comprising:
 a unit pixel suitable for supporting initialization of an output node and outputting a pixel signal corresponding to incident light through the output node;
 a switching block suitable for initializing the output node and deciding an initial voltage of the output node; and
 a read-out processing unit suitable for reading out the pixel signal.

12. The CMOS image sensor of claim 11, wherein the switching block includes a single transistor controlled by a switching control signal provided from an external control unit.

13. The CMOS image sensor of claim 12, wherein the single transistor has a drain terminal electrically coupled to the output node, operates according to the switching control signal applied to a gate terminal, removes a residual voltage of the output node to a ground through a source terminal, and initializes the output node, thereby deciding the initial voltage value.

14. The CMOS image sensor of claim 11, wherein tie switching block includes a MOS transistor having an output impedance value ranging from 0Ω to 0.01Ω.

15. The CMOS image sensor of claim 11, wherein the unit pixel blocks an output path to the output node during a period in which the output node is initialized.

* * * * *